United States Patent [19]

Moister, Jr.

[11] 3,926,360

[45] Dec. 16, 1975

[54] METHOD OF ATTACHING A FLEXIBLE PRINTED CIRCUIT BOARD TO A RIGID PRINTED CIRCUIT BOARD

[75] Inventor: Douglas E. Moister, Jr., Plymouth, Mich.

[73] Assignee: Burroughs Corporation, Detroit, Mich.

[22] Filed: May 28, 1974

[21] Appl. No.: 473,698

[52] U.S. Cl. .................. 228/180; 29/628; 228/240; 228/248; 228/254

[51] Int. Cl.² .......................................... H01R 43/00

[58] Field of Search .......... 29/471.1, 488, 489, 493, 29/495, 498, 502, 628; 228/179, 180, 212, 223, 240, 248, 254

[56] References Cited

UNITED STATES PATENTS

| | | | |
|---|---|---|---|
| 3,374,531 | 3/1968 | Bruce | 29/498 |
| 3,392,442 | 7/1968 | Napier | 29/502 |
| 3,486,223 | 12/1969 | Butera | 29/471.1 |
| 3,520,055 | 7/1970 | Jannett | 29/493 |
| 3,583,063 | 6/1971 | Growney | 29/471.1 |
| 3,632,955 | 1/1972 | Cruickshank | 29/471.1 |
| 3,659,333 | 5/1972 | Johnson | 29/493 |
| 3,736,653 | 6/1973 | Maierson | 29/502 |
| 3,744,129 | 7/1973 | Dewey | 29/628 |
| 3,808,681 | 5/1974 | Law | 29/502 |

*Primary Examiner*—Al Lawrence Smith
*Assistant Examiner*—Robert C. Watson
*Attorney, Agent, or Firm*—Ronald L. Taylor; Edwin W. Uren

[57] ABSTRACT

An improved method for soldering the terminals of a rigid printed circuit board to those of a flexible printed circuit board, such method comprising the steps of focusing a radiant heating source upon each of a plurality of solder globules deposited in a like number of through holes in the terminals of the rigid printed circuit board for controlling of the capillary flow of the molten solder radially from the through holes to form solder points of controlled depth and pattern between the terminals of the boards.

7 Claims, 4 Drawing Figures

METHOD OF ATTACHING A FLEXIBLE PRINTED CIRCUIT BOARD TO A RIGID PRINTED CIRCUIT BOARD

BACKGROUND OF THE INVENTION

1. Field of the Invention

The present invention relates to a method for effecting a connection between the terminals of separate printed circuit boards and in particular to the focused infrared soldering together of such terminals.

2. Prior Art

In the past, methods used for soldering printed circuit (PC) boards and their terminals ranged from simple immersion in liquid solder to the relatively sophisticated wave soldering technique. Recently various forms of infrared soldering have also come into use in selected applications.

In the present instance, where it is desired to directly solder the terminals of a flexible printed circuit board (hereinafter referred to as a flexible PC) to those of a rigid printed circuit board (hereinafter referred to as a rigid PC) certain special problems are encountered. The first of these problems involves the application of heat to the area to be soldered. A flexible PC with its very limited area to be soldered, and its hypersensitivity to thermal degradation, does not lend itself to the older methods of direct soldering due to their characteristic diffuseness of application and general non-controllability.

Another problem concerns the impreciseness with which prepositioned solder may be applied when in its molten state, and the resultant likelihood of creating a weak bond between the soldered terminals due to an uneven depth of the solder film between the terminals. Ancillary to the above problem is the likelihood of a surplusage of molten solder overflowing onto the non-terminal land area of the PC board to thereby cause charing of the land or over-jumping of the solder to other circuits.

An additional problem in connecting a flexible PC to a rigid PC in the susceptability of flexible PCs to mechanical stress over extended periods of time, and the likelihood that such stress will lead to breakdowns in the soldered terminal joints.

SUMMARY OF THE INVENTION

It is accordingly an object of the present invention to provide a reliable and economical method for directly soldering the terminals of a flexible PC to those of a rigid PC to form secure terminal joints.

It is a further object of the invention to provide a focused radiant heating source such as infrared for the controlled and precise soldering of PC boards having thermal sensitive substrates, to thus enable the direct soldering of the PC terminals without stripping the substrate away from the terminals or building the terminals out away from the substrate.

An additional object of the invention is to provide a centrally located solder-filled through-hole in the rigid PC terminal such that the infrared heating source might be applied to one end of the through-hole to thereby melt the solder with but minimal risk of damaging the thermal sensitive substrate of the flexible PC, the melted solder being thereupon subjected to the capillary phenomenon of flowing out through the opposite end of the through-hole in a uniform radial pattern to form a terminal joint of superior bonding quality.

It is yet another object of the invention to provide a plurality of solder-filled through-holes for each terminal joint that is to be formed between a rigid PC and a flexible PC, such that a like number of solder points per terminal joint may be provided, the redundant sum of the solder points rendering each terminal joint relatively impervious to joint failure.

Still another object of the present invention is to provide means for applying an even backing pressure to the broadside of the flexible PC opposite the side to which the rigid PC is to be joined, the effect of such even pressure in conjunction with the capillary flow of the solder between the associated terminals being the establishment of terminal joints of precisely equal depth.

In carrying out the objects of the invention, the tinned terminals of a flexible PC are applied, in the desired registration, to the tinned terminals of a rigid PC. Each of the rigid PC terminals is provided with a plurality of solder-filled through-holes located in the areas where the solder points of a terminal joint are desired. Focused radiant energy is aimed simultaneously upon the solder-filled holes of the rigid PC, on the side thereof opposite the side where the terminal joint is to be formed. Upon the resultant melting of the solder in the holes, the molten solder seeps outwardly from the holes in a radially regular pattern. A resilient pad is applied to the broadside of the flexible PC opposite the side to which the rigid PC is to be joined, such that upon solidification of the molten solder, a solder film of unvarying depth is established between the joined terminals.

BRIEF DESCRIPTION OF THE DRAWING

Various other objects, advantages and meritorious features of the invention will become more fully apparent from the following specification, appended claims and accompanying drawing figures.

The features of a specific embodiment of the invention are illustrated in the drawing figures, in which.

DESCRIPTION OF A PREFERRED EMBODIMENT OF THE INVENTION

Referring to FIGS. 1 to 4 inclusive by the characters of reference, there is illustrated segments of a flexible PC and a rigid PC the terminals of which may be securely and solely joined together by the present inventive process, apparatus used in the process being also illustrated.

Figure 1:
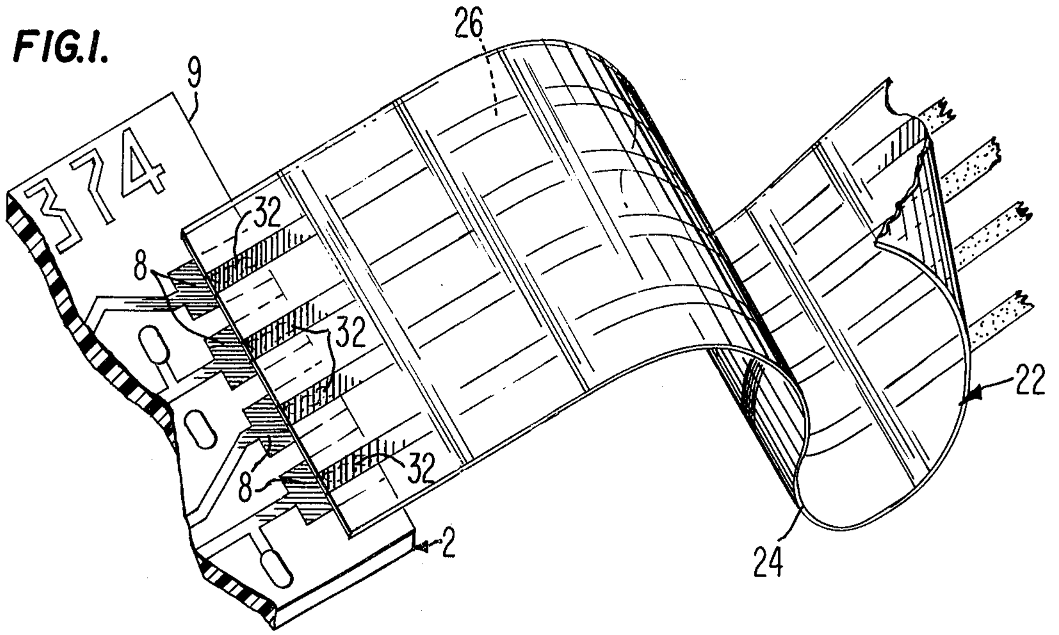
FIG. 1 is a perspective view of a rigid and a flexible printed circuit board with their respective terminals shown in soldered relationship.
Figures 2, 3:
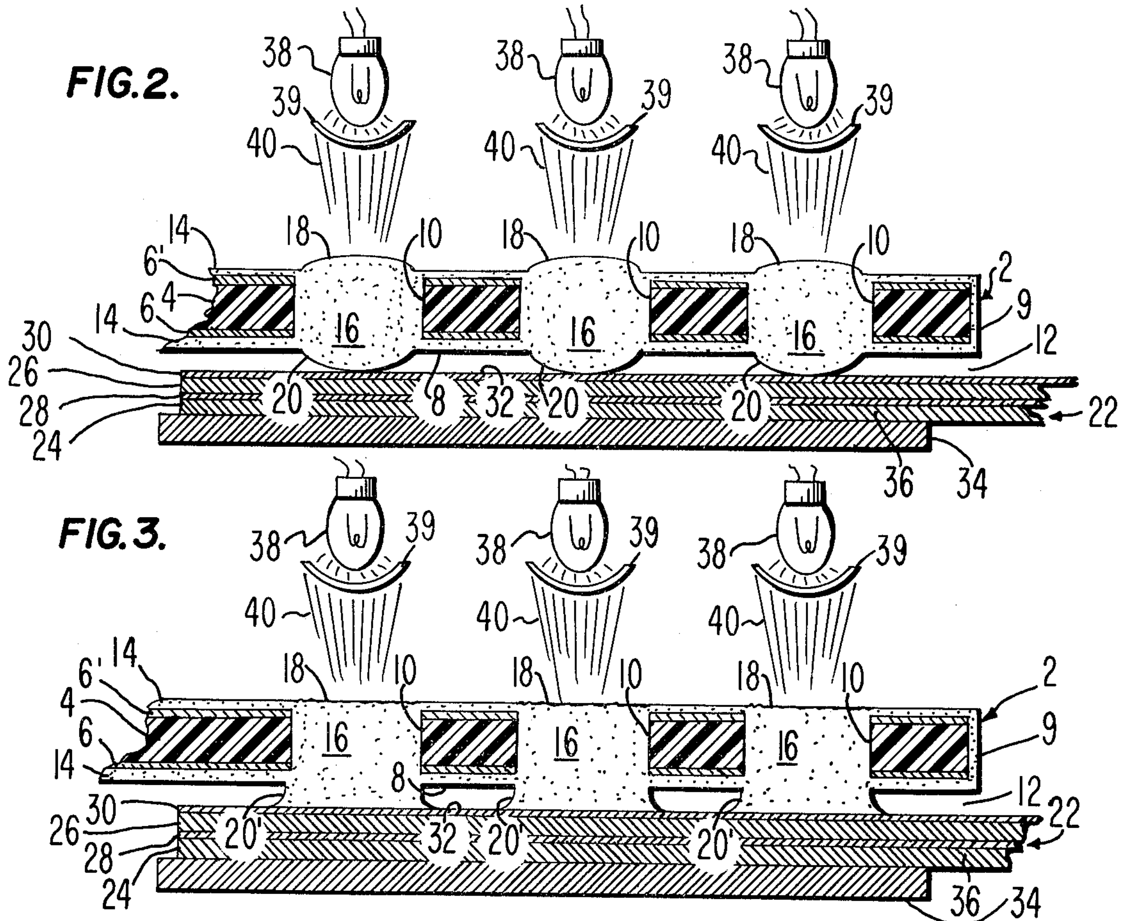
FIG. 2 is a side view of corresponding terminals of a rigid and a flexible printed circuit board as they would appear at the beginning of the reflow soldering process.
FIG. 3 is a side view of the terminals of FIG. 2 as they would appear at the end of the reflow soldering process.

Typical printed circuit boards to the joinder of which the present inventive process is particularly directed are illustrated in FIGS. 2 and 3. A rigid PC 2 may be comprised of a glass epoxy laminate substrate 4, with copper clad printed circuits 6 and 6′ additively or subtractively applied thereto by etching or other methods well known in the art. The copper clad circuits 6 and 6′, as well as the terminal pads 8 thereof, are generally plated as at 14 with a tin-lead mixture such as 60% tin and 40% lead having a low eutectic point, the plating 14 providing an adhesive surface that lends itself to reflow soldering. A flexible PC 22 may be comprised of a polymide base 24 such as that produced by Du Pont under the trademark KAPTON, with copper clad printed circuits 26 bonded thereto by means of an adhesive 28 of the epoxy type, the copper clad circuits 26 and terminals 32 thereof being also coated with a tin-lead mixture as illustrated at 30.

To securably join the substantially flat or planar terminals 8 of the rigid PC to the substantially flat or planar terminals 32 of the flexible PC by the present inventive method, without damaging the polymide base 24 of the flexible PC, a plurality of through holes 10 are first provided in each terminal 8 of the rigid PC 2 to which a terminal 32 of the flexible PC is to be joined. It is preferred that three such holes 10 be provided for each connection, and that they be disposed in a line perpendicular to the outside edge 11 of the terminal 8. A multiplicity of through holes 10 per terminal 8 provides a redundant back-up in case of solder joint failure, and thus the number of holes 10 used per terminal joint may be increased or decreased depending upon circumstance and individual preference. In addition to the provision of the through holes 10 in the terminals 8 of the rigid PCs, the inventive method of attaching a flexible PC to a rigid PC is comprised of the steps of (1) introducing globules of solder 16 into the through holes 10 of the rigid PC 2, (2) forming the globules of solder in the through holes 10 into convex meniscuses as shown at 18 and 20, as for example a by-product of applying the plating 14 on the copper clad circuits 6 and 6' of the rigid PC 2, (3) aligning the terminals 8 of the rigid PC 2 with the terminals 32 of the flexible PC 22, (4) backing the flexible PC 22 with a resilient pad as at 34 in FIGS. 2 and 3, (5) clamping the rigid PC 2, the flexible PC 22 and the pad 34 together with the terminals 8 and 32 thereof disposed in aligned relationship, and (6) locally aiming a focused radiant heating source at the top meniscuses 18 of the solder globules 16 to effect controlled reflow soldering, the result being the formation of secure substantially circular solder points of a uniform thickness or depth as illustrated at 20' in FIG. 3.

The convex meniscuses formed by the solder globules 16 during the plating process 14 or by the deposition of a molten globule of solder 16 into the through-holes 10 are caused by the forcing of the molten solder out of the through holes 10 by capillary action, while being restrained by the surface tension of the through holes 10, a balance between these conflicting forces producing a regular curvilinear contour along the upper surfaces 18 and lower surfaces 20 thereof. The bottom meniscuses 20 of the globules 16 will be slightly distorted by gravity to produce a somewhat fuller contour than the contour of the meniscuses 18, although this distortion will not impair the solderability of the globules during the reflow soldering process.

Alignment of the terminals 8 and 32 prior to the clamping and reflow soldering steps could be parallelly effectuated as illustrated in FIGS. 2 and 3, that is, with the terminals oppositely overlapping, or aligned in reverse coincidental configuration, in which case no functional loss would be experienced. The resilient backing pad 34 illustrated in FIGS. 2 and 3 would preferably be composed of a material such as silicon rubber having both resilient and heat resistant properties and would be applied to the broadside 36 of the flexible PC 22 opposite the side containing the copper clad circuits 26. Upon aligning the rigid PC 2, the flexible PC 22 and the backing pad 34 as above indicated, these elements would be clamped together in such manner that the resilient pad 34 applies an even pressure along the area of the terminals 32 corresponding to the convex solder meniscuses 20 of the rigid PC 2, such meniscuses 20 forming the solder points 20' during the reflow soldering process. Following clamping of the rigid PC 2, the flexible PC 22 and the backing pad 34, other optional steps may be taken before initiating the reflow soldering process by means of the focused radiant heating source. As an example a weak flux such as rosin may be applied to the terminals 32 of the flexible PC 22, such that the oxides therein formed might be removed and the wetability of the terminal surfaces enhanced. Another optional pre-soldering step would be the preheating of the rigid PC 2 and the flexible PC 22, in the areas that are to be connected, with a diffused long-wave infrared radiant heating source (not shown). Convection or conduction preheating sources might also be used as substitutes. Gradual preheating of the boards would avoid the likelihood of thermal shock and structural degradation to the boards if abruptly brought to soldering temperature.

In the actual reflow soldering process, a focused radiant heating source illustrated at 38 in FIGS. 2 and 3 is locally aimed at the top meniscuses 18 each of of the solder filled holes 10. A short-wave infrared spot or strip heater of the type manufactured by CONRAY may be used for the heating sources 38, with focusing accomplished by either refractive lenses as shown at 39 in FIGS. 2 and 3 and/or reflective mirrors. A matrix of heating sources 38 and lenses 39 suitable for reflow soldering individual terminals of the rigid and flexible PC's may be used, or a larger matrix developed for the production reflow soldering of all of the terminals of the boards simultaneously. A decision in the matter of matrix size would be dependent upon the heat susceptability of the non-terminal surfaces of the boards adjacent the terminals 8 and 32, the ability to control the positioning of the boards to be connected and the relative positioning of the radiant heating elements 38, and, finally, the controllability of the intensity and interval of operation of the radiant heating sources themselves. For reasons hereinafter explained, a matrix suitable for the reflow soldering of individual terminals, such as is illustrated in FIGS. 2 and 3, is preferred whenever the amount and time-duration of infrared radiation is constant or can be controlled, thereby reducing the likelihood of radiant heat damage to the boards that might otherwise result from use of a larger and more diffuse matrix.

Figure 4:
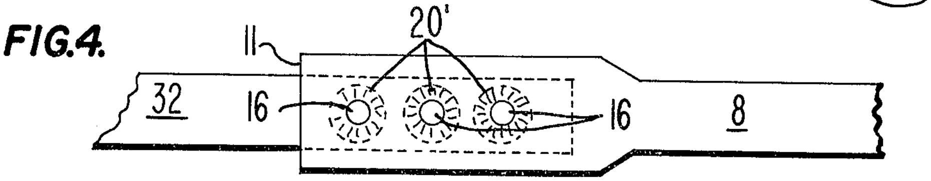
FIG. 4 is a plan view of a soldered joint between corresponding terminals of the printed circuit boards.

During the reflow soldering process, each of the solder globules 16 will, upon absorbing a sufficient amount of thermal energy via a locally focused beam 40 transmitted to its upper meniscus 18, begin to change its state in a relatively short time until the entire globule 16 becomes molten. The molten solder will then commence to flow by virtue of the capillary action promoted by the heat expansion of the globule, the effect of gravity on the molten solder, and the adhesion property provided the terminal 32 of the flexible PC by the application of flux thereto. Solder flow will normally stop at or before the edge of the corresponding land areas of the terminals 8 and 32 are reached, as shown in FIG. 4, due to the controlled intensity and time-duration of the infrared beam 40 that is applied, the finite amount of the solder globule 16 that is introduced into the through holes 10, the limited fluxed areas of the terminals 8 and 32, and the equilibrium that is reached with respect to the surface tension of the solder itself. The expansion of each solder globule 16 from its bottom meniscus 20, during reflow soldering, will tend to conform to a uniform two-dimensional radial pattern as shown in FIG. 4, such radial pattern providing a film of solder expandably spreading from the through hole 10 to form a solder point 20' as shown in FIG. 3.

Use of the resilient backing pad 34 during the reflow soldering process will serve to apply an even pressure to all of the bottom meniscuses 20 of the solder globules 16 that are subjected simultaneously to the infrared beams 40, the solidification of the molten solder in the corresponding through holes 10 thereby producing solder points 20' of a controlled and equal third dimensional depth, as also illustrated in FIG. 3. This equal depth may be programmably minimized via the pad 34 and yet be adequate in depth to permit effective binary alloying of the metals in the formation of the terminal joint 12.

Particular features of the present invention include the use of focused infrared which results in the application of a precise beam 40 to the solder globules 16, such beam being controlled in intensity and time-duration such that the PC boards 2 and 22, and particularly the heat sensitive polymide base 24 and epoxy adhesive 28 of the flexible PC 22, will not be degraded by heat.

The through holes 10 provided by the inventive method serve as convenient solder repositories 16 for use in the reflow soldering process, such repositories being particularly well suited as focal points for the infrared beams 40 to function as pressure cookers within which the solder globules 16 are brought quickly to a molten state without subjecting the surrounding areas of the PC boards to conductive heat degradation. Additionally, the capillary flow of molten solder from the centrally located holes 10 into the terminal joints 12 serves to promote a maximum distribution of the solder points 20' in the multi-point joint, to thereby maximize the bonding area of the joint.

The herein-described reflow soldering method, in addition to providing an optimal electrical connection between the terminals of flexible and rigid PC boards, also serves to provide an especially desirable mechanical connection between the boards, such mechanical connection being resistive to the kinds of stress, flexing and metal fatigue that commonly characterize applications where flexible PC boards are required.

From the foregoing description of an inventive reflow soldering process, and the apparatus required thereby, it will be apparent to those skilled in the art that both the process and apparatus may be modified in various ways without departing from the true spirit and scope of the inventive concept. Accordingly, it is to be understood that the described process and illustrated apparatus herein disclosed represents but a preferred embodiment which it is intended shall be limited only by the appended claims.

What is claimed is:

1. A method for solderably joining a selected terminal of a flexible printed circuit board to a selected terminal of a rigid printed circuit board comprising the steps of:

a. providing one or more apertures in the rigid printed circuit board through its said selected terminal, b. plating the surfaces of said selected terminals, c. pre-heatably filling each of said apertures with a globule of solder of sufficient size to produce a protruding convex upper and lower meniscus thereof as a byproduct of said plating, d. bringing the selected terminal of said flexible printed circuit board into compressible contact with each of said lower convex meniscuses of solder in the apertures of said rigid printed circuit board, e. arranging an infrared heating source and focusing means therefor in aligned focusing relationship relative to each of said upper meniscuses of solder, and f. controllably activating each of said infrared heating sources such that an infrared beam of controlled intensity and time-duration is directed upon each of said upper convex meniscuses to bring each of said solder globules to a molten state and to thereby capillarily transform each of said lower convex meniscuses to a radially formed solder joint between said selected terminals when said molten solder solidifies.

2. The method defined in claim 1 wherein the step of controllably activating more than one of said infrared heating sources is preceded by the step of supportably and evenly backing said flexible printed circuit board on the side thereof opposite the selected terminal thereof, such that each of said radially formed solder joints between said selected terminals is of uniform depth.

3. The method defined in claim 1 wherein the step of bringing the selected terminal of the flexible printed circuit board into compressible contact with each of the lower convex meniscuses of solder in the apertures of the selected terminal of the rigid printed circuit board comprises the steps of:

a. registering the selected terminals together in overlapping relationship, b. compressibly backing said flexible printed circuit board on the side thereof opposite its said selected terminal, and c. clamping the printed circuit boards together such that the selected terminals are retainably aligned in said overlapping registration.

4. The method defined in claim 1 wherein the step of controllably activating each of the infrared heating sources includes the steps of:

a. focusing a beam from said heating source upon the upper convex meniscus of solder with which said heating source is aligned, and b. controlling the intensity and time duration of said infrared beam for maximum dispersion of the molten solder from the lower end of each of the solder filled apertures to form radial patterns via capillary flow intermediate said selected and registrationally aligned terminals.

5. A method for solderably joining the substantially planar terminals of a flexible printed circuit board to the substantially planar terminals of a rigid printed circuit board comprising the steps of:

a. forming one or more apertures in the rigid printed circuit board through each of its said terminals, b. plating the terminals of the flexible printed circuit board and the rigid printed circuit board, and the walls of the apertures formed in the rigid printed circuit board, c. depositing a globule of solder in each of the apertures in the terminals of the rigid printed circuit board as a byproduct of said plating of the terminals, d. bringing the terminals of the flexible printed circuit board into firm contact with the terminals of the rigid printed circuit board such that they are prepositioned in overlapping registry with each other, e. supportably presenting a resilient back pad to the flexible printed circuit board on the side thereof opposite its said terminals, and f. controllably focusing radiant heat locally upon the exposed sides of the globules of solder in each of the apertures formed in the terminals of the rigid printed circuit board for enabling the molten solder to capillarily flow between the registered terminals to radially form corrsponding solder joints therebetween.

6. A method of solderably bonding the plated terminals of a flexible printed circuit board to the plated terminals of a rigid printed circuit board comprising the steps of:

a. forming at least one aperture through said rigid printed circuit board at each of its said plated terminals;

b. depositing a globule of solder in each of said apertures;

c. aligning the plated terminals of said flexible printed circuit board with the solder-containing apertures of the corresponding plated terminals of said rigid printed circuit board;

d. applying a predetermined amount of pressure to the side of said flexible printed circuit board not in contact with the plated terminals of said rigid printed circuit board to insure a uniform depth of the solder joint; and e. locally applying a predetermined controlled amount of radiant energy to the side of each of said solder globules not in contact with the plated terminals of said flexible printed circuit board for effecting a capillary flow of solder into a radially patterned solder bond of a uniform dispersion and depth at each of the points of contact between the plated terminals of said flexible printed circuit board and the corresponding apertured plated terminals of said rigid printed circuit board.

7. The method of claim 6 wherein said step of depositing a globule of solder in each of said apertures includes the step of preheatedly depositing a molten globule of solder in each of said apertures and forming a convex lower surface of said globule which protrudes out of said aperture for contacting said corresponding plated terminals of said flexible printed circuit board.

* * * * *